United States Patent
Yeo

[19]

[11] Patent Number: 6,097,234
[45] Date of Patent: Aug. 1, 2000

[54] THREE-PHASE CLOCK SIGNAL GENERATION CIRCUIT FOR LCD DRIVER

[75] Inventor: Jeong Beom Yeo, Seoul, Rep. of Korea

[73] Assignee: Hyundai Electronics Industries Co., Ltd., Kyoungki-do, Rep. of Korea

[21] Appl. No.: 09/024,369

[22] Filed: Feb. 12, 1998

[30] Foreign Application Priority Data

Feb. 14, 1997 [KR] Rep. of Korea ......................... 97-4539

[51] Int. Cl.[7] .................................................. H03K 3/037
[52] U.S. Cl. .......................... 327/295; 327/293; 327/258; 345/99; 395/556
[58] Field of Search ............................... 327/99, 293, 295, 327/415, 258, 263; 345/94, 99, 208, 211; 395/556, 558, 551, 552

[56] References Cited

U.S. PATENT DOCUMENTS

| | | | |
|---|---|---|---|
| 3,649,845 | 3/1972 | Foch | 327/131 |
| 5,491,442 | 2/1996 | Mirov et al. | 327/295 |
| 5,610,627 | 3/1997 | Inamori et al. | 345/99 |
| 5,652,536 | 7/1997 | Nookala et al. | 327/298 |
| 5,682,175 | 10/1997 | Kitamura | 345/99 |

FOREIGN PATENT DOCUMENTS

6-167946  6/1994  Japan ................................. G09G 3/20

*Primary Examiner*—Timothy P. Callahan
*Assistant Examiner*—Terry L. Englund
*Attorney, Agent, or Firm*—Ware, Fressola, Van Der Sluys & Adolphson LLP

[57] ABSTRACT

A three-phase clock signal generation circuit for a source driver of TFT-LCDs. A clock signal generation circuit for LCD driver includes: a divider dividing an external main clock signal by two and generating a division clock signal; a three-phase clock signal generator receiving the division clock signal from the divider and sequentially generating first to third-phase clock signals; and a sampling mode selector receiving the first to third-phase clock signals and in response to an external mode selection signal, sequentially outputting the first to third-phase clock signals as three-phase clock signals or simultaneously outputting one of the first to third-phase clock signals as the three-phase clock signals. The three phase clock signal generator comprises first, second and third phase clock signal generators sequentially generating first, second and third clock signals with the division clock signal, respectively.

22 Claims, 5 Drawing Sheets

FIG.5A MCLK

FIG.5B DCLK

FIG.5C /DCLK

FIG.5D CPH1

FIG.5E CPH2

FIG.5F CPH3

FIG.5G CPH1'

FIG.5H CPH2'

FIG.5I CPH3'

FIG.5J CPH1'

FIG.5K CPH2'

FIG.5L CPH3'

THREE-PHASE CLOCK SIGNAL GENERATION CIRCUIT FOR LCD DRIVER

BACKGROUND OF THE INVENTION

1. Field of the Invention

The present invention generally relates to a driver of thin film transistor-liquid crystal displays(hereinafter referred to as TFT-LCDs), and more particularly, to a three-phase clock signal generation circuit for a source driver of TFT-LCDs capable of sequentially or simultaneously generating three-phase clock signals for sampling R(red), G(green) and B(blue) data using one clock signal.

2. Description of the Related Art

Generally, in a source driver of TFT-LCDs, since a clock signal for sampling R, G, B data has high speed as a resolution increases, it is necessary that the driver operates at high speed. However, it is limited to operate the driver of TFT-LCDs at high-speed. Accordingly, in conventional art, the frequency of a clock signal is lowered using three clock signals generated by dividing the clock signal.

However, in this conventional art, since a controller generates three-phase clock signals for data sampling and applies them to the source driver through three lines, the three lines are required for transmitting clock signals. Furthermore, the three-phase clock signals maybe applied to the source driver with selected one from a first mode or a second mode. In the first mode (simultaneous mode), the three-phase clock signals are simultaneously applied to the source driver. In the second mode (sequential mode), the three-phase clock signals are sequentially applied to the source driver. Therefore, an additional selection line is required for the purpose of selecting one from the first mode or the second mode. As a result, there is a need for four lines in order to apply the three-phase clock signals to the source driver.

SUMMARY OF THE INVENTION

It is therefore an object of the present invention to provide a three-phase clock signal generation circuit for a source driver of TFT-LCDs capable of sequentially or simultaneously generating three-phase clock signals for sampling R(red), G(green) and B(blue) data using one clock signal.

To accomplish this above object, a clock signal generation circuit for LCD driver which receives an external main clock signal to generate three-phase clock signals according to the present invention comprises: a divider dividing the main clock signal by two and generating a division clock signal; a three-phase clock signal generator receiving the division clock signal from the divider and sequentially generating first to third-phase clock signals; and a sampling mode selector receiving the first to third-phase clock signals from the three-phase clock signal generator and in response to an external mode selection signal, sequentially outputting the first to third-phase clock signals as the three-phase clock signals or simultaneously outputting one of the first to third-phase clock signals as the three-phase clock signals.

In this embodiment, the three-phase clock signal generator comprises first, second and third-phase clock signal generators receiving the division clock signal and sequentially generating the first, second and third-phase clock signals respectively.

In this embodiment, each of the first, second and third-phase clock signal generators comprises: a trigger signal generation means generating a trigger signal at a rising edge of the division clock signal from the divider or of an inverted division clock signal where the division clock signal is inverted; a clock signal generation means generating the first, second or third-phase clock signals with the trigger signal from the trigger signal generation means; a delay means delaying an output signal of the clock signal generation means for a selected time; and a clock signal selection means receiving an output signal of the delay means to generate first and second clock selection signals and making the trigger signal generation means generate the trigger signal at the rising edge of the division clock signal or of the inverted division clock signal according to the first and second clock selection signals.

Furthermore, the trigger signal generation means of the first, second and third-phase clock signal generation means comprises: an inversion means inverting the division clock signal and generating the inverted division clock signal; a first generation means generating the trigger signal at the rising edge of the division clock signal with the first clock selection signal of the clock signal selection means; a second generation means generating the trigger signal at the rising edge of the inverted division clock signal with the second clock selection signal of the clock signal selection means; and an output means outputting the trigger signal generated from the first or second generation means.

In this embodiment, the sampling mode selector comprises first, second and third phase clock signal output means, each which receives the first, second or third-phase clock signal from the three-phase clock signal generator, respectively and in response to the mode selection signal, sequentially output the first, second or third-phase clock signal, respectively, as the three-phase clock signals or simultaneously output one of them as the three-phase clock signals.

Furthermore, each of the first, second and third-phase clock signal output means comprises: an inversion means inverting the mode selection signal and providing the inverted mode selection signal; a sequential mode selection means sequentially selecting the first, second or third-phase clock signal according to the mode selection signal; a simultaneous mode selection means simultaneously selecting one clock signal of the first to third-phase clock signals according to the inverted mode selection signal; and an output means outputting an output signal of the simultaneous mode selection means or the sequential mode selection means as the three-phase clock signals.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

FIG. 5A to FIG. 5L show driving waveforms of the three-phase clock signal generation circuit of FIG. 3 and FIG. 4.

DETAILED DESCRIPTION OF THE INVENTION

Hereinafter, a preferred embodiment of the present invention will be explained in more detail with reference to the accompanying drawings.

Figure 1:
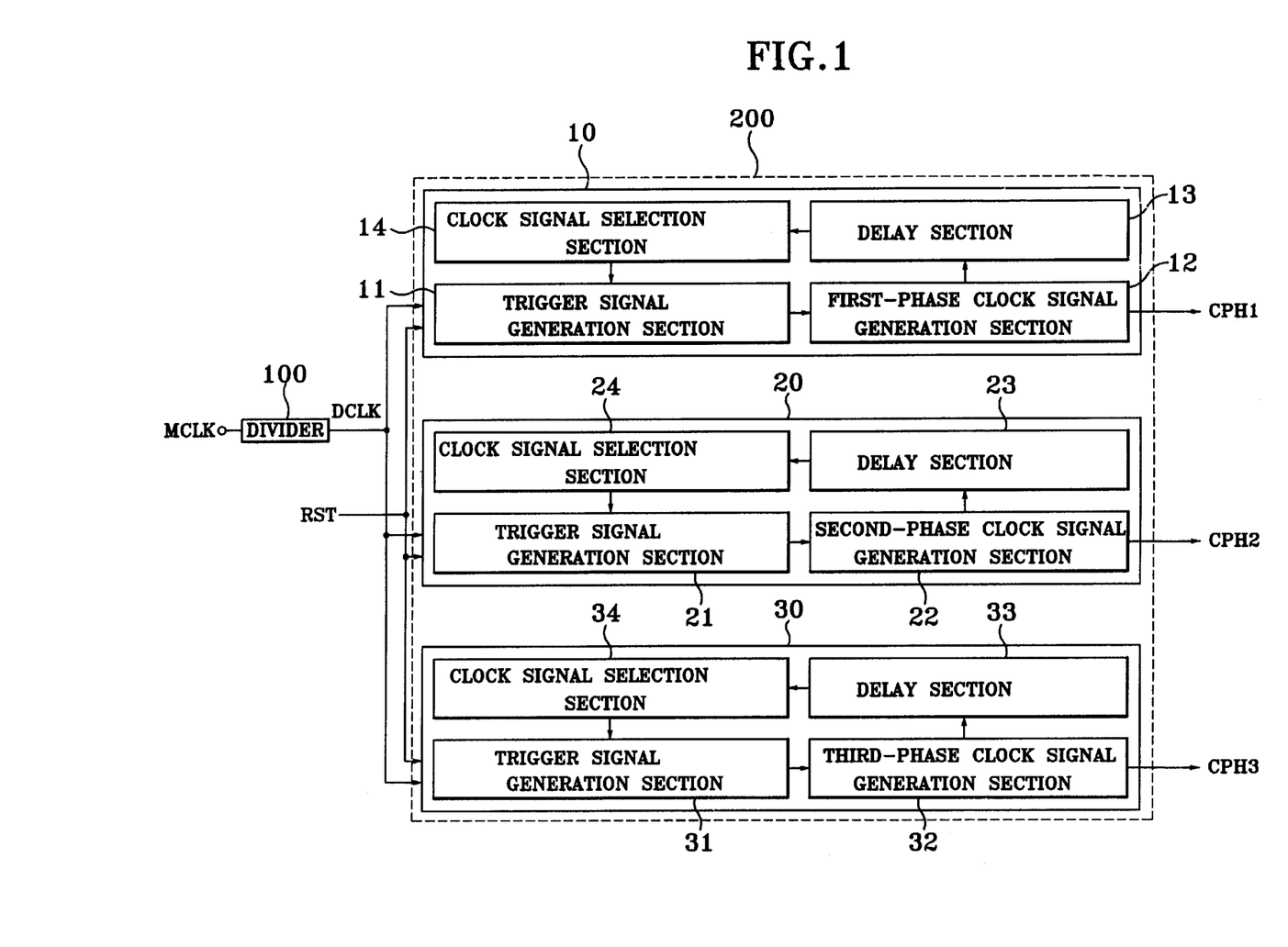
FIG. 1 is a block diagram of a three-phase clock generator in a three-phase clock signal generation circuit for sampling data of a LCD driver according to an embodiment of the present invention.
Figure 2:
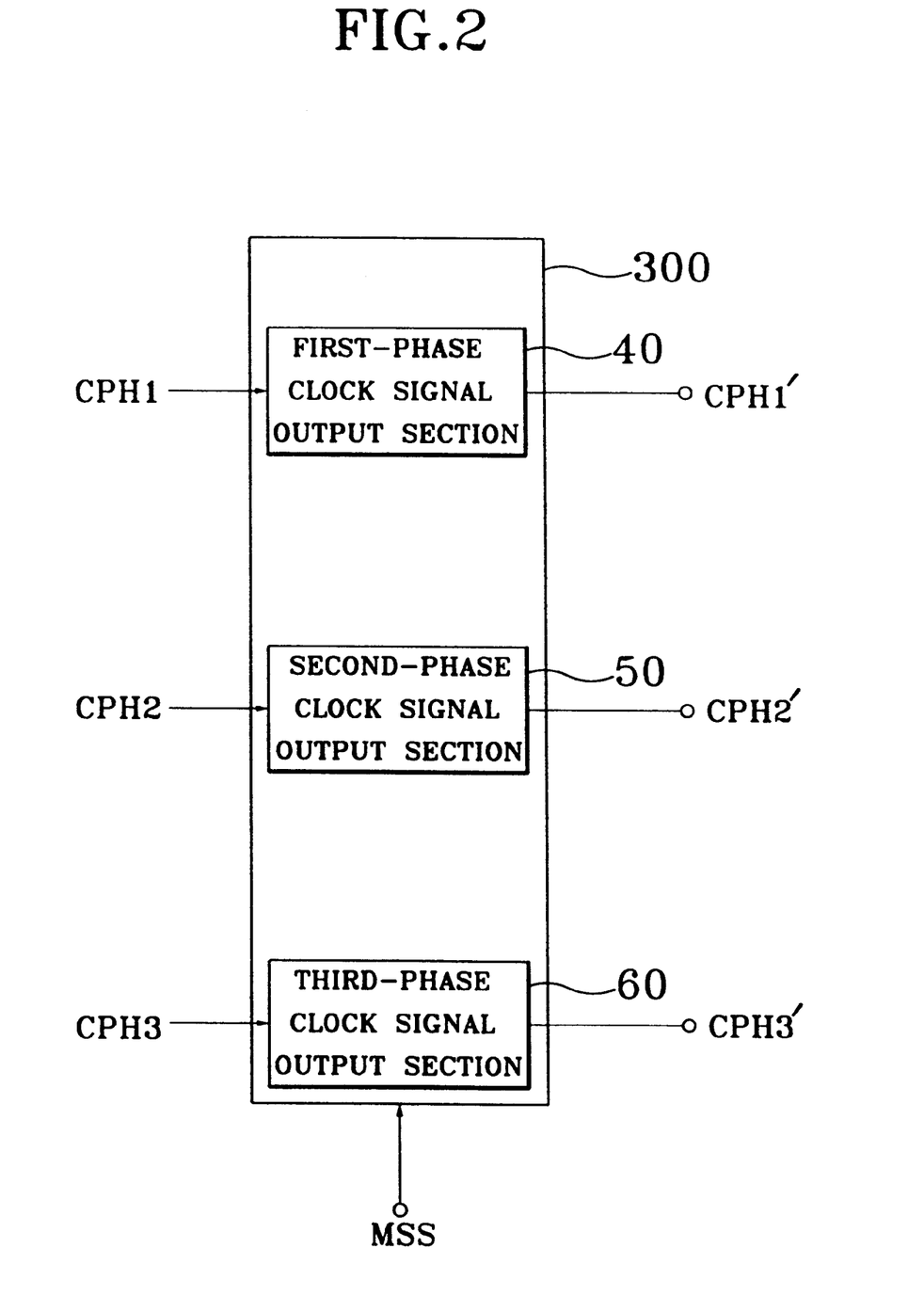
FIG. 2 is a block diagram of a sampling mode selector in the three-phase clock signal generation circuit for sampling data of a LCD driver according to an embodiment of the present invention.
Figure 3:
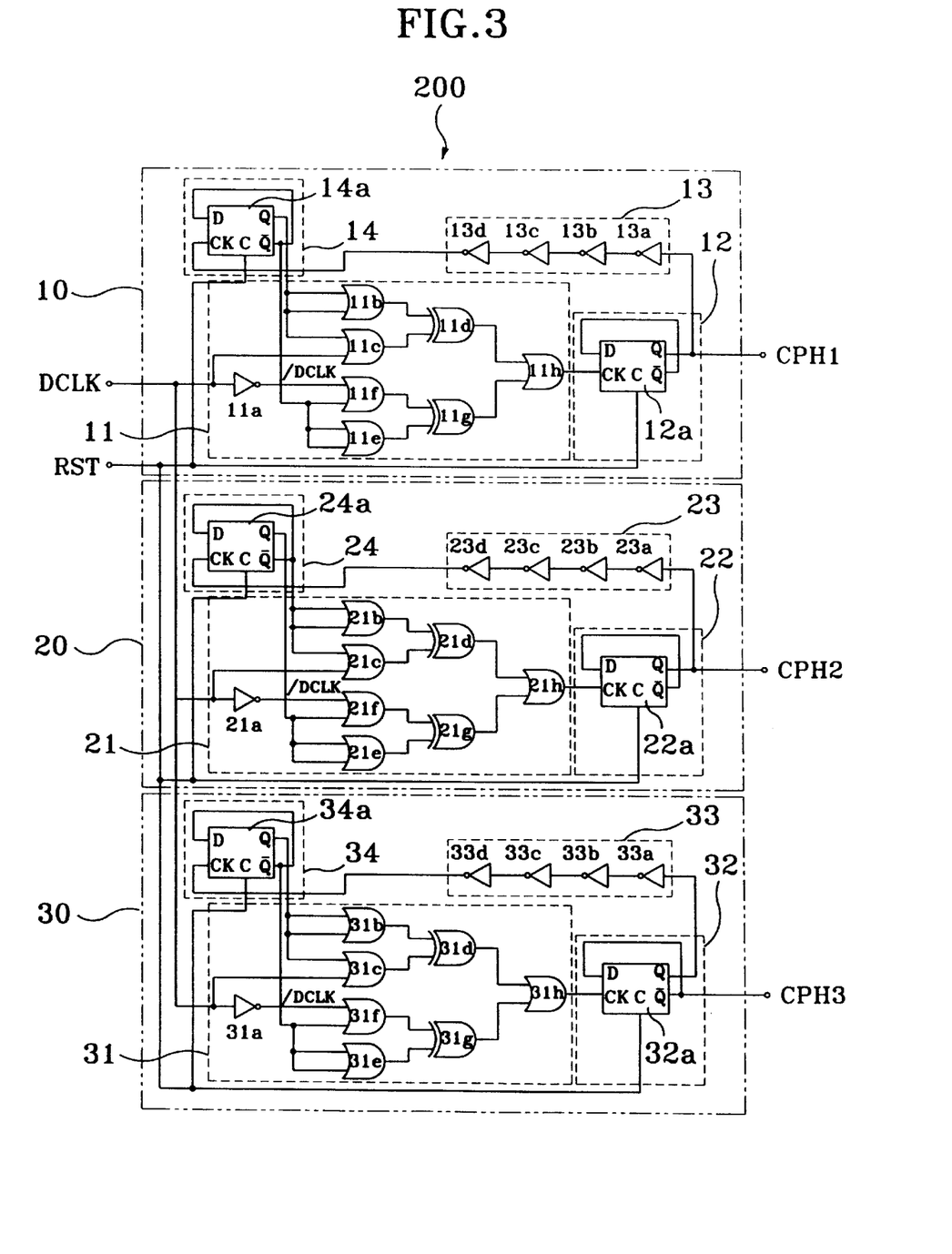
FIG. 3 is a detailed circuit diagram of the three-phase clock signal generator in the three-phase clock signal generation circuit of FIG. 1.
Figure 4:
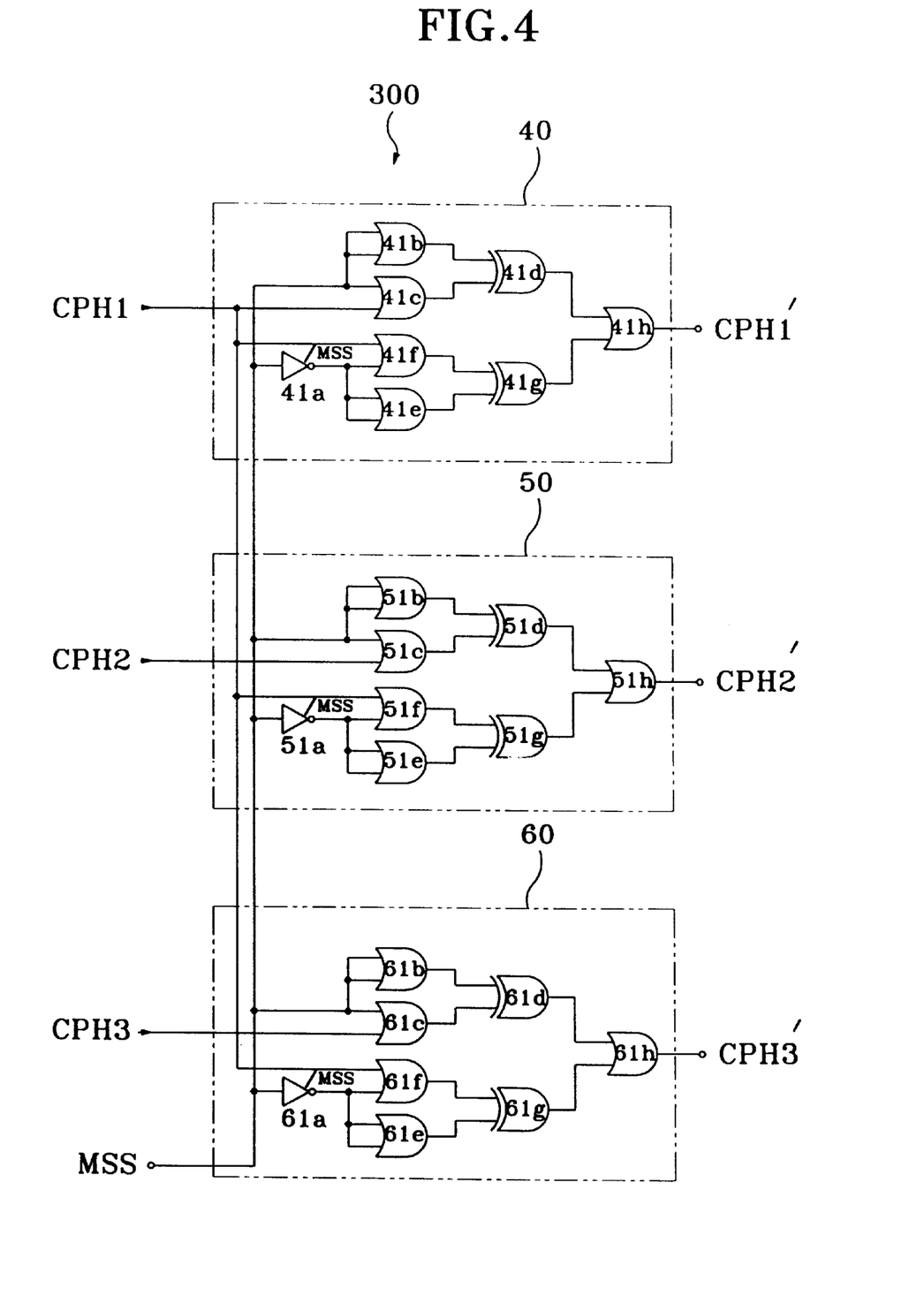
FIG. 4 is a detailed circuit diagram of the sampling mode selector in the three-phase clock signal generation circuit of FIG. 2.

FIG. 1 and FIG. 2 show block diagrams of a three-phase clock signal generator and a sampling mode selector in a three-phase clock signal generation circuit for a source driver of a TFT-LCD according to an embodiment of the present invention, respectively. FIG. 3 and FIG. 4 are detailed circuit diagrams of the three-phase clock signal generator and the sampling mode selector in FIG. 1 and FIG. 2, respectively.

Referring to FIG. 1 and FIG. 2, the three-phase clock signal generation circuit according to the present invention, comprises a divider 100, a three-phase clock signal generator 200, and a sampling mode selector 300. The divider 100 divides an external main clock signal MCLK by two and outputs a division clock signal DCLK to the three-phase clock signal generator 200. The three-phase clock signal generator 200 sequentially generates three-phase clock signals CPH1, CPH2 and CPH3 by receiving the division clock signal DCLK from the divider 100. The sampling mode selector 300 receives the first to third-phase clock signals CPH1, CPH2 and CPH3 sequentially generated from the three-phase clock signal generator 200 and in response to an external mode selection signal MSS, sequentially outputs the first to third-phase clock signals CPH1, CPH2 and CPH3 as three-phase clock signals CPH1', CPH2' and CPH3' or simultaneously outputs one clock signal of the first to third-phase clock signals CPH1, CPH2 and CPH3 as the three-phase clock signals CPH1', CPH2' and CPH3'.

The three-phase clock signal generator 200 includes first, second and third-phase clock signal generators 10, 20 and 30. The first, second and third-phase clock signal generators 10, 20 and 30 receive the division clock signal DCLK from the divider 100 to sequentially generate first, second and third-phase clock signals CPH1, CPH2 and CPH3, respectively.

The first phase clock signal generator 10 includes: a trigger signal generation section 11; a first-phase clock signal generation section 12; a delay section 13; and a clock signal selection section 14. The trigger signal generation section 11 receives the division clock signal DCLK from the divider 100 and generates a trigger signal at a rising edge of the division clock signal DCLK or an inverted division clock signal /DCLK where the division clock signal DCLK is inverted. The first-phase clock signal generation section 12 generates the first-phase clock signal CPH1 with the trigger signal received from the trigger signal generation section 11. The delay section 13 delays the first-phase clock signal CPH1 received from the first-phase clock signal generation section 12 for a selected time. The clock signal selection section 14 receives an output signal of the delay means to generating first and second clock selection signals. Thus, the trigger signal generation section 11 generates the trigger signal at the rising edge of the division clock signal DCLK or of the inverted division clock signal /DCLK, in accordance with the first and second clock selection signal from the clock signal selection section 14.

Referring to FIG. 3, the trigger signal generation section 11 in the first-phase clock generator 10 includes an inversion section for inverting the division clock signal DCLK to generate the inverted division clock signal /DCLK, a first generation section for generating the trigger signal at the rising edge of the division clock signal DCLK according to the first clock selection signal of the clock signal selection section 14, a second generation section for generating the trigger signal at the rising edge of the inverted division clock signal /DCLK according to the second clock selection signal of the clock signal selection section 14, and an output section for providing the trigger signal generated from the first or second generation section to the first-phase clock signal generation section 12.

Referring to FIG. 3, in the trigger signal generation section 11, the inversion section includes an inverter 11a for inverting the division clock signal DCLK and generating the inverted division clock signal /DCLK. The first generation section includes a first OR gate 11b receiving the first clock selection signal from the clock signal selection section 14, a second OR gate 11c receiving the first clock selection signal fron the clock signal selection section 14 and the division clock signal DCLK, and a first exclusive OR gate 11d receiving output signals of the first and second OR gates 11b and 11c to generate the trigger signal at the rising edge of the division clock signal DCLK. The second generation section includes a third OR gate 11e receiving the second clock selection signal from the clock signal selection section 14, a fourth OR gate 11f receiving the second clock selection signal from the clock signal selection section 14 and the inverted division clock signal /DCLK, and a second exclusive OR gate 11g receiving output signals of the third and fourth OR gates 11e and 11f to generate the trigger signal at the rising edge of the inverted division clock signal /DCLK. The output section includes a fifth OR gate 11h receiving output signals of the first and second exclusive OR gates 11d and 11g and provides the trigger signal generated at the rising edge of the division clock signal DCLK or the inverted division clock signal to the first-phase clock signal generation section 12.

The first-phase clock generation section 12 includes a D flip flop 12a where the output signal of the fifth OR gate 11h is applied to its clock signal CK, its output signal Q is provided to the delay section 13 and the sampling mode selector 300 as the first-phase clock signal CPH1 and its inverting output signal /Q is fed back to its input signal D. The delay section 13 includes a plurality of inverters 13a, 13b, 13c and 13d, which delay the first phase clock signal CPH1 generated from the D flip flop 12a for a selected time. The clock signal selection section 14 includes a D flip flop 14a where an output signal of the delay section 13 is applied to its clock signal CK, its inverting output signal /Q is fed back to its input signal D and its output signal Q and inverting output signal /Q are respectively applied to the first and second generation sections in the trigger signal generation section 11 as the first and second clock selection signals.

Referring to FIG. 1, The second-phase clock signal generator 20 includes: a trigger signal generation section 21; a second-phase clock signal generation section 22; a delay section 23; and a clock signal selection section 24. The second trigger signal generation section 21 generates a trigger signal to the second-phase clock signal generation section 22 at the rising edge of the division clock signal DCLK or of an inverted division clock signal /DCLK by receiving the division clock signal DCLK from the divider 100. The second-phase clock signal generation section 22 generates the second-phase clock signal CPH2 with the trigger signal received from the trigger signal generation section 21. The delay section 23 delays the second-phase clock signal CPH2 received from the second-phase clock signal generation section 22 for a selected time and provides the delayed second-phase clock signal to the clock signal selection section 24. The clock signal selection section 24 receives an output signal of the delay section 23 which is the delayed second-phase clock signal CPH2, to generate first and second clock selection signals to the trigger signal generation section 21. The trigger signal generation section 21 generates the trigger signal at the rising edge of the division clock signal DCLK or of an inverted division clock signal /DCLK, in accordance with the first and second clock selection signals from the clock signal selection section 24.

As shown in FIG. 3, each constitution of the second-phase clock signal generator 20 is similar to that of the first-phase clock signal generator 10. Merely, an output signal Q of a D flip flop 24a in the clock signal selection section 24 is applied to input signals of third and fourth OR gates 21e and 21f as the second clock selection signal. Furthermore, an inverting output signal /Q of the D flip flop 24a is applied to input signals of first and second OR gates 21b and 21c as the first clock selection signal.

Referring to FIG. 1, the third-phase clock signal generator 30 includes: a trigger signal generation section 31; a third-phase clock signal generation section 32; a delay section 33; and a clock signal selection section 34. The trigger signal generation section 31 generates a trigger signal to the third-phase clock signal generation section at the rising edge of the division clock signal DCLK or of an inverted division clock signal /DCLK by receiving the division clock signal DCLK from the divider 100. The third-phase clock signal generation section 32 generates the third-phase clock signal CPH3 with the trigger signal received from the trigger signal generation section 31. The delay section 33 delays the output signal received from the third-phase clock signal generation section 32 for a selected time and provides an output signal to the clock signal selection section 34. At this time, the delay section 33 receives the output signal of the third-phase clock signal generation section 32, which has an inverted phase with the third-phase clock signal CPH3. The clock signal selection section 34 receives an output signal of the delay section 33 to generate first and second clock selection signals to the trigger signal generation section 31. The trigger signal generation section 31 generates the trigger signal at the rising edge of the division clock signal DCLK or of an inverted division clock signal /DCLK, in accordance with the first and second clock selection signals from the clock signal selection section 34.

As shown in FIG. 3, each constitution element of the third-phase clock signal generator 30 is similar to that of the first-phase clock signal generator 10. The third-phase clock signal generation section 32 in the third-phase clock signal generator 30 includes a D flip flop 32a where an output signal of the fifth OR gate 31h in the trigger signal generation section 31 is applied to its clock signal, its inverting output signal /Q is applied to the sampling mode selector 300 as the third-phase clock signal CPH3 and fed back to its input signal and its output signal Q is applied to the delay section 33.

A signal RST is a reset signal which resets the D flip flops 14a, 24a and 34a in the clock signal selection sections 14, 24 and 34 and the D flip flops 12a, 22a and 32a in the first to third-phase clock signal generation sections 12, 22 and 32.

Referring to FIG. 2, the sampling mode selector 300 includes first, second and third-phase clock signal output sections 40, 50 and 60, which receive the first, second and third-phase clock signals CPH1, CPH2, CPH3, respectively and outputs them sequentially as three-phase clock signals CPH1', CPH2' and CPH3' or simultaneously one of them as three-phase clock signals CPH1', CPH2' and CPH3' according to the mode selection signal MSS. In the preferred embodiment of the invention, of the first, second third-phase clock signals CPH1, CPH2 and CPH3 sequentially generated from the first to third-phase clock generators 10, 20 and 30 in the three-phase clock generator 200, the first-phase clock signal CPH1 is selected and simultaneously provided as the three-phase clock signals CPH1', CPH2' and CPH3' through the sampling mode selector 300.

Referring to FIG. 4, the first-phase clock signal output section 40 in the sampling mode selector 300 includes an inversion section for inverting the mode selection signal MSS and providing an inverted mode selection signal /MSS, a sequential mode selection section for selecting the first-phase clock signal CPH1 for a sequential mode from the first-phase clock signal generator 10 in the three-phase clock signal generator 200 according to the mode selection signal MSS, a simultaneous mode selection section for selecting the first-phase clock signal CPH1 for a simultaneous mode according to the inverted mode selection signal /MSS, and the output section for receiving an output signal of the simultaneous mode selection section or the sequential mode selection section and outputting it as the first-phase clock signal CPH1' of the three-phase clock signals.

Referring to FIG. 4, in the first-phase clock signal output section 40, the inversion section includes an inverter 41a for inverting the mode selection signal MSS and providing the inverted mode selection signal /MSS to the simultaneous mode selection section. The sequential mode selection section includes a first OR gate 41b receiving the mode selection signal MSS, a second OR gate 41c receiving the mode selection signal MSS and the first-phase clock signal CPH1 from the first-phase clock signal generator 10, and a first exclusive OR gate 41d receiving output signals of the OR gates 41b and 41c and providing the first-phase clock signal for a sequential mode to the output section.

The simultaneous mode selection section includes a third OR gate 41e receiving the inverted mode selection signal /MSS from the inversion section, a fourth OR gate 41f receiving the inverted mode selection signal /MSS and the first-phase clock signal for a simultaneous mode from the first-phase clock signal generator 10, and a second exclusive OR gate 41g receiving output signals of the OR gates 41e and 41f and providing the first-phase clock signal CPH1 for a simultaneous mode to the output section.

Furthermore, the output section includes a fifth OR gate 41h receiving an output signal of the first or second exclusive OR gate 41d or 41g to provide it as the first-phase clock signal CPH1' of the three-phase clock signals.

The second-phase clock signal output section 50 in the sampling mode selector 300 includes an inversion section for inverting the mode selection signal MSS and providing an inverted mode selection signal /MSS, a sequential mode selection section for selecting the second-phase clock signal CPH2 for a sequential mode from the second-phase clock signal generator 20 according to the mode selection signal MSS, a simultaneous mode selection section for selecting the first-phase clock signal CPH1 for a simultaneous mode according to the inverted mode selection signal /MSS, and the output section for receiving an output signal of the sequential mode selection section or the simultaneous mode selection section and outputting it as the second-phase clock signal CPH2' of the three-phase clock signals.

The third-phase clock signal output section 60 in the sampling mode selector 300 includes an inversion section for inverting the mode selection signal MSS and providing an invertedmode selection signal /MSS, asequentialmode selection section for selecting the third-phase clock signal CPH3 for a sequential mode from the third-phase clock signal generator 30 according to the mode selection signal MSS, a simultaneous mode selection for selecting the first-phase clock signal CPH1 for a simultaneous mode according to the inverted mode selection signal /MSS, and the output section for receiving an output signal of the simultaneous mode selection section or the sequential mode selection section and outputting it as the third-phase clock signal CPH3' of the three-phase clock signals.

Each constitution element of the second and third phase clock signal output sections 50 and 60 is similar to that of the first-phase clock signal output section 40. In the first-phase clock signal output section 40 and the second-phase clock signal output section 50, the second OR gates 41c and 51c receive output signals Q of the D flip flops 12a and 22a in the first and second-phase clock generators 10 and 20, respectively, while the second OR gate 61c in the third-phase clock signal output section 60 receives the inverting output signal /Q of the D flip flop 32a in the third-phase clock generator 30.

Figure 5A:
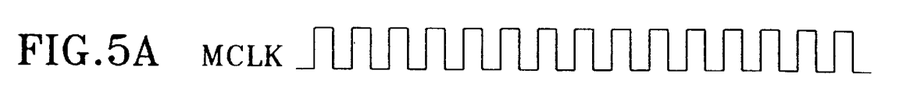
Figure 5B:
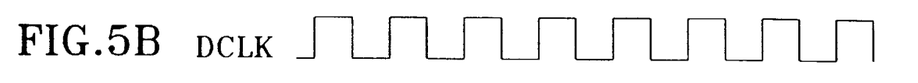
Figure 5C:
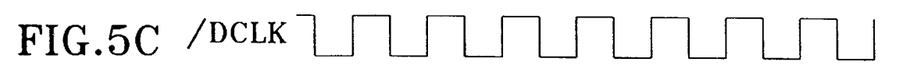

Operation of the three-phase clock signal generation circuit according to the present invention will be explained with reference to FIG. 5A through FIG. 5L FIG. 5A shows a main clock signal MCLK. The divider 100 divides the main clock signal MCLK by two and provide a division clock signal DCLK as shown in FIG. 5B to the three-phase clock signal generator 200.

Figure 5D:
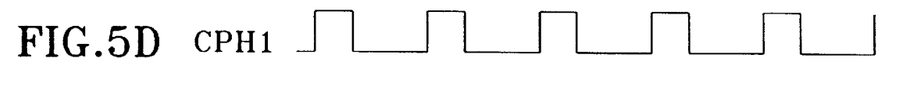

In the first-phase clock signal generator 10, the OR gate 11c receives the output signal Q of the D flip flop 14a as the first clock selection signal from the clock signal selection section 14 and the division clock signal DCLK. The first-phase clock signal generator 10 generates the first-phase clock signal CPH1 as shown in FIG. 5D at the rising edge of the division clock signal DCLK.

More specially, at initial state, the output signal Q of the D flip flop 14a is at a low state and the inverting output signal /Q of the D flip flop 14a is at a high state. The third and fourth OR gates 11e and 11f respectively receive the inverting output signal /Q of the D flip flop 14a as the second clock selection signal and generates output signals of a high state regardless of the inverted division clock signal /DCLK.

On the other hand, the second OR gate 11c receive the output signal Q of the D flip flop 14a as the first clock selection signal to generate the output signal varying with the division clock signal DCLK. Therefore, the fifth OR gate 11h generates the trigger signal to the D flip flop 12a of the first-phase clock signal generation section 12 as a clock signal CK at the rising edge of the division clock signal DCLK. Accordingly, the D flip flop 12a generates the first-phase clock signal CPH1 as shown in FIG. 5D at the rising edge of the division clock signal DCLK.

In the second-phase clock signal generator 20, the third and fourth OR gates 21e and 21f receive the output signal Q of the D flip flop 24a as an input signal, which is the second clock selection signal and the first and second OR gates 21b and 21c receive the inverting output signal /Q of the D flip flop 24a as an input signal, which is the first clock selection signal. Accordingly, the second-phase clock generation section 22 generates the second-phase clock signal CPH2 of FIG. 5E at the rising edge of the inverted division clock signal /DCLK of FIG. 5C through the D flip flop 22a and provides it to the delay section 23 and the sampling mode selector 300.

In the third-phase clock signal generator 30, the first and second OR gates 31b and 31c receive the output signal Q of the D flip flop 34a and the third and fourth OR gates 31e and 31f receive the inverting output signal /Q. The third-phase clock signal generator 30 generates the third-phase clock signal CPH3 of FIG. 5F at the rising edge of the division clock signal DCLK through the D flip flop 32a and provides it to the delay section 33 and the sampling mode selector 300.

The three-phase clock generator 200 sequentially generates the first to third-phase clock signals CPH1, CPH2 and CPH3 at the rising edge of the inverted division clock signal /DCLK, the division clock signal DCLK and the inverted division clock signal /DCLK through the first to third-phase clock signal generators 10 through 30, respectively, following sequential generation of the first to third-phase clock signals CPH1, CPH2 and CPH3 at the rising edge of the division clock signal DCLK, the inverted division clock signal /DCLK and the division clock signal DCLK respectively. Accordingly, the three-phase clock signal generator 200 sequentially generates the first to third-phase clock signals CPH1–CPH3 as shown in FIG. 5D to FIG. 5F at the rising edge of the division clock signal DCLK and the inverted division clock signal /DCLK in turn.

In above embodiment, at first, the first and third-phase clock signal generators 10 and 30 respectively generate the first and third-phase clock signals CPH1 and CPH3 at the rising edge of the division clock signal DCLK, while the second-phase clock signal generator 20 generates the second-phase clock signal CPH2 at the rising edge of the inverted division clock signal /DCLK. By changing input signals of the trigger signal generation sections 11, 21 and 31, which are received from the D flip flops 14a, 24a and 34a, respectively, as above described, it is possible to generate the first and third-phase clock signals CPH1 and CPH3 at the rising edge of the inverted division clock signal /DCLK and to generate the second-phase clock signal CPH2 at the rising edge of the division clock signal DCLK.

Furthermore, in the first-phase clock signal generator 10 the first delay section 13 delays the output signal of the D flip flop 12a for a selected time and then outputs a delayed signal to the D flip flop 14a as the clock signal CK in order to prevent malfunction of the three-phase clock signal generator 200 in case where the output signal Q of the D flip flop 12a is directly applied to the D flip flop 12a as clock signal CK. The delay sections 23 and 33 in the second and third-phase clock signal generators 20 and 30 function as the delay section 13.

Figure 5E:
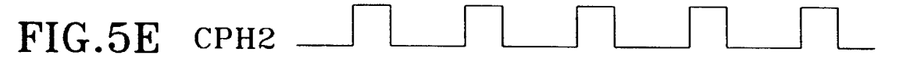
Figure 5F:
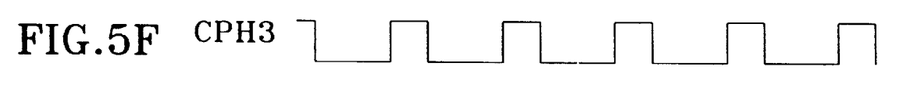
Figure 5G:
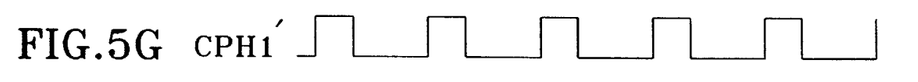
Figure 5H:
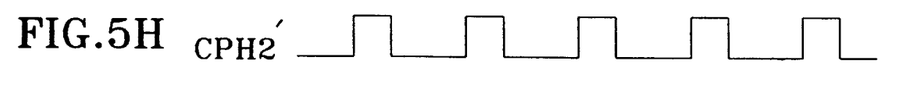
Figure 5I:
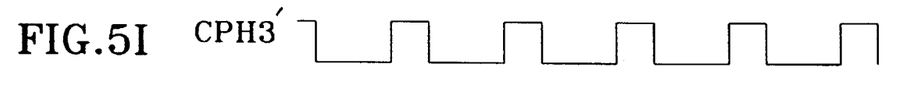
Figure 5J:
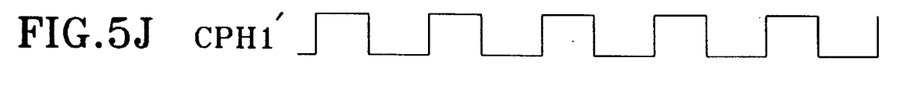
Figure 5K:
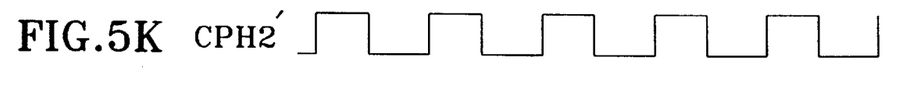
Figure 5L:
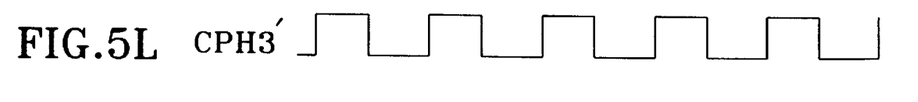

In a sequential mode, according to the mode selection signal MSS, the first, second and third-phase clock signals CPH1, CPH2 and CPH3 as shown in FIG. 5D to FIG. 5F, which are generated from the first, second and third-phase clock signal generators 10, 20 and 30 of the three-phase clock signal generator 200, are sequentially outputted as the three-phase clock signals CPH1', CPH2' and CPH3' as shown in FIG. 5G to FIG. 5I. In a simultaneous mode, one clock signal of the first, second and third-phase clock signals CPH1, CPH2, CPH3 is selected, for example the first-phase clock signal CPH1 and is simultaneously outputted as the three-phase clock signal CPH1', CPH2' and CPH3' as shown in FIG. 5J to FIG. 5L, through the first to third-phase clock signal output section 40, 50 and 60 in the sampling mode selector 300.

More specially, in the sequential mode, the mode selection signal MSS of a low state is applied to the first, second and third-phase clock signal output sections 40, 50 and 60.

The second exclusive OR gates 41g, 51g and 61g of the simultaneous mode selection sections generate output signals of a low state. Furthermore, the first exclusive OR gates 41d, 51d and 61d of the sequential mode selection sections generate output signals the first, second and third-phase clock signals CPH1, CPH2 and CPH3, respectively. Thus, the sampling mode selector 300 receives the first, second and third-phase clock signals CPH1, CPH2 and CPH3 and sequentially outputs them as the three-phase clock signals CPH1', CPH2' and CPH3', as shown in FIG. 5G to FIG. 5I through the fifth OR gates 41h, 51h and 61h, respectively.

On the other hand, in the simultaneous mode, the mode selection signal MSS of a high state is applied to the first, second and third-phase clock signal output sections 40, 50 and 60. The first exclusive OR gates 41d, 51d and 61d of the sequential mode selection sections generate output signals of low state. The second exclusive OR gates 41g, 51g and 61g of the simultaneous mode selection sections simultaneously generate the first phase clock signal CPH1, respectively. Thus, the sampling mode selector 300 receives the first phase clock signal CPH1 of the first to third-phase clock signals CPH1, CPH2 and CPH3 and simultaneously outputs it as the three-phase clock signals CPH1', CPH2' and CPH3' as shown in FIG. 5J to FIG. 5L through the fifth OR gates 41h, 51h and 61h.

In above embodiment, in a simultaneous mode, the sampling mode selector 300 receives the first-phase clock signal CPH1 and simultaneously outputs it as three-phase clock signal CPH1'–CPH3'. However, it is possible to output the second or the third-phase clock signal CPH2 or CPH3 as the three-phase clock signals CPH1'–CPH3' at simultaneous mode.

According to the present invention, the three-phase clock signal generator generates the three-phase clock signals by only one division clock signal regardless of a sequential mode or a simultaneous mode. Therefore, it can solve the problem that because a controller directly generates three-phase clock signals, the controller generates three-phase clock signals again in switching a data output mode.

Furthermore, there is no need to change waveform or period of clock signals with a data output mode, so that it can construct LCD driver system to be stable. In addition, it is possible to use a division clock signal independent of the controller by constituting a circuit for synchronizing the clock signal, so that the number of clock signal lines decreases, resulting in decrease in the noise effect.

Although the preferred embodiment of the present invention has been disclosed for illustrative purpose, those skilled in the art will appreciate that various modifications, additions and substitutions are possible, without the scope and spirit of the invention as described in the accompanying claims.

What is claimed is:

1. A clock signal generation circuit for a LCD driver, which receives an external main clock signal to generate three-phase clock signals, comprising:
   a divider dividing the main clock signal by two and generating a division clock signal;
   a three-phase clock signal generator receiving the division clock signal from the divider and sequentially generating first to third-phase clock signals, the three-phase clock signal generator including first, second and third-phase clock signal generators receiving the division clock signal and sequentially generating the first, second and third-phase clock signals, respectively,
   wherein each of the first, second and third-phase clock signal generators comprises:
   a trigger signal generation means generating a trigger signal at a rising edge of the division clock signal from the divider or of an inverted division clock signal where the division clock signal is inverted;
   a clock signal generation means generating the respective first, second or third-phase clock signal with the trigger signal from the respective trigger signal generation means;
   a delay means delaying the respective first, second or inverted third-phase clock signal where the third-phase clock signal is inverted by the third-phase clock signal generation means for a selected time;
   a clock signal selection means generating first and second clock selection signals according to the respective first, second or inverted third-phase clock signal delayed through the respective delay means and making the respective trigger signal generation means generate the respective trigger signal at the rising edge of the division clock signal or of the inverted division clock signal according to the first and second clock selection signals; and
   a sampling mode selector receiving the first to third-phase clock signals from the three-phase clock signal generator and in response to an external mode selection signal, sequentially outputting the first to third-phase clock signals as the three-phase clock signals or simultaneously outputting one of the first to third-phase clock signals as the three-phase clock signals.

2. The clock signal generation circuit for LCD driver as claimed in claim 1, wherein each of the trigger signal generation means of the first, second and third-phase clock signal generators comprises:
   an inversion means inverting the division clock signal and generating the inverted division clock signal;
   a first generation means generating the respective trigger signal at the rising edge of the division clock signal with the first clock selection signal of the respective clock signal selection means;
   a second generation means generating the respective trigger signal at the rising edge of the inverted division clock signal with the second clock selection signal of the respective clock signal selection means; and
   an output means outputting the trigger signal generated from the first or second generation means to the respective clock signal generation means.

3. The clock signal generation circuit for a LCD driver as claimed in claim 2, wherein the inversion means of the trigger signal generation means in each of the first, second and third-phase clock signal generators includes an inverter for inverting the division clock signal and providing the inverted division clock signal to the second generation means of the respective trigger signal generation means in each of the first, second and third-phase clock signal generators.

4. The clock signal generation circuit for a LCD driver as claimed in claim 2, wherein the first generation means of the trigger signal generation means in the first-phase clock signal generator, comprises:
   a first OR gate receiving the first clock selection signal of the respective clock signal selection means;
   a second OR gate receiving the first clock selection signal and the division clock signal from the divider; and
   a first exclusive OR gate receiving output signals of the first and second OR gates to generate the trigger signal at the rising edge of the division clock signal to the output means of the trigger signal generation means in the first-phase clock signal generator.

5. The clock signal generation circuit for a LCD driver as claimed in claim 4, wherein the second generation means of the trigger signal generation means in the first-phase clock signal generator, comprises:
  a third OR gate receiving the second clock selection signal from the respective clock signal selection means;
  a fourth OR gate receiving the second clock selection signal and the inverted division clock signal; and
  a second exclusive OR gate receiving output signals of the third and fourth OR gates to generate the trigger signal at the rising edge of the inverted division clock signal to the output means of the trigger signal generation means in the first-phase clock signal generator.

6. The clock signal generation circuit for a LCD driver as claimed in claim 5, wherein the output means of the trigger signal generation means in the first-phase clock signal generator includes a fifth OR gate receiving the trigger signal generated at the rising edge of the division clock signal or the inverted division clock signal from the first or second exclusive OR gate in the first and second generation means to output it to the clock signal generation means in the first-phase clock signal generator.

7. The clock signal generation circuit for a LCD driver as claimed in claim 1, wherein the clock signal generation means in each of the first and second-phase clock signal generators includes a D flip flop where the trigger signal of the respective trigger signal generation means of the first and second-phase clock signal generators is applied as a clock signal, its inverting output signal is fed back as its input signal and its output signal is provided as the respective first and second-phase clock signals to the sampling mode selector and the respective delay means of the first and second-phase clock signal generators.

8. The clock signal generation circuit for a LCD driver as claimed in claim 7, wherein each of the delay means in the first and second-phase clock signal generators includes a plurality of inverters, which delays the respective first or second-phase clock signal of the D flip flop of each respective clock signal generation means in the first and second-phase clock signal generators and provides the respective delayed first or second-phase clock signal to the respective clock signal selection means in the first and second-phase clock signal generators.

9. The clock signal generation circuit for LCD driver as claimed in claim 1, wherein the clock signal generation means in the third-phase clock signal generator includes a D flip flop where the trigger signal of the trigger signal generation means from the third-phase clock signal generator is applied as a clock signal, its inverting output signal is fed back as its input signal and provided to the sampling mode selector as the third-phase clock signal and its output signal which is the inverted third-phase clock signal is provided to the delay means of the third-phase clock signal generator.

10. The clock signal generation circuit for a LCD driver as claimed in claim 9, wherein the delay means in the third-phase clock signal generator includes a plurality of inverters, which delays the output signal of the D flip flop of the clock signal generation means in the third-phase clock signal generator and provides the delayed signal to the clock signal selection means in the third-phase clock signal generator.

11. The clock signal generation circuit for a LCD driver as claimed in claim 1, wherein each of the clock signal selection means in the first to third-phase clock signal generators includes a D flip flop where the respective delayed first, second or inverted third-phase clock signal of the delay means in the respective first to third-phase clock signal generators is applied as a clock signal, wherein an inverting output signal of the D flip flop of the respective first or third-phase clock signal generator is fed back as its input signal and provided as the respective second clock selection signal to the trigger signal generation means of the respective first or third-phase clock signal generator, and an output signal of the D flip flod of the respective first or third-phase clock signal generator is provided as the first clock selection signal to the trigger signal generation means of the respective first or third-phase clock signal generator and wherein an inverting output signal of the D flip flop of the second-phase clock signal generator is fed back as its input signal and provided as the first clock selection signal to the trigger signal generation means of the second-phase clock signal generator, and an output signal of the D flip flop of the second-phase clock signal generator is Drovided as the second clock selection signal to the trigger signal generation means of the second-phase clock signal generator.

12. The clock signal generation circuit for a LCD driver as claimed in claim 2, wherein the first generation means of the trigger signal generation means in the second-phase clock generator, comprises:
  a first OR gate receiving the first clock selection signal from the clock signal selection means of the second-phase clock signal generator;
  a second OR gate receiving the first clock selection signal and the division clock signal; and
  a first exclusive OR gate receiving output signals of the first and second OR gates to generate the trigger signal at the rising edge of the division clock signal to the output means of the trigger signal generation means in the second-phase clock signal generator.

13. The clock signal generation circuit for a LCD driver as claimed in claim 12, wherein the second generation means of the trigger signal generation means of the second-phase clock signal generator, comprises:
  a third OR gate receiving the second clock selection signal from the clock signal selection means of the second-phase clock signal generator;
  a fourth OR gate receiving the second clock selection signal and the inverted division clock signal; and
  a second exclusive OR gate receiving output signals of the third and fourth OR gates to generate the trigger signal at the rising edge of the inverted division clock signal to the output means of the trigger signal generation means in the second-phase clock signal generator.

14. The clock signal generation circuit for a LCD driver as claimed in claim 13, wherein the output means of the trigger signal generation means in the second-phase clock signal generator includes a fifth OR gate receiving the trigger signal generated at the rising edge of the division clock signal or the inverted division clock signal from the respective first or second exclusive OR gate in the first and second generation means of the trigger signal generation means in the second-phase clock signal generator to output it to the clock signal generation means of the second-phase clock signal generator.

15. The clock signal generation circuit for a LCD driver as claimed in claim 2, wherein the first generation means of the trigger signal generation means in the third-phase clock signal generator, comprises:
  a first OR gate receiving the first clock selection signal from the clock signal selection means of the third-phase clock signal generator;

a second OR gate receiving the first clock selection signal and the division clock signal; and a first exclusive OR gate receiving output signals of the first and second OR gates to generate the trigger signal at the rising edge of the division clock signal to the output means of the trigger signal generation means in the third-phase clock signal generator.

16. The clock signal generation circuit for a LCD driver as claimed in claim 15, wherein the second generation means of the trigger signal generation means in the third-phase clock signal generator, comprises:

a third OR gate receiving the second clock selection signal from the clock signal selection means of in the third-phase clock signal generator;

a fourth OR gate receiving the second clock selection signal and the inverted division clock signal; and a second exclusive OR gate receiving output signals of the third and fourth OR gates to generate the trigger signal at the rising edge of the inverted division clock signal to the output means of the trigger signal generation means in the third-phase clock signal generator.

17. The clock signal generation circuit for a LCD driver as claimed in claim 16, wherein the output means of the trigger signal generation means in the third-phase clock signal generator includes a fifth OR gate receiving the trigger signal generated at the rising edge of the division clock signal or the inverted division clock signal from the respective first or second exclusive OR gate in the first and second generation means of the trigger signal generation means in the third-phase clock signal generator to output it to the clock signal generation means of the third-phase clock signal generator.

18. The clock signal generation circuit for a LCD driver as claimed in claim 1, wherein the sampling mode selector comprises first, second and third-phase clock signal output means which respectively receive the first to third-phase clock signals from the three-phase clock signal generator and in response to the mode selection signal, sequentially output the first to third-phase clock signals as the three-phase clock signals, respectively or simultaneously output one of them as the three-phase clock signals, wherein each of the first, second and third-phase clock signal output means comprises:

an inversion means inverting the mode selection signal and providing the inverted mode selection signal;

a sequential mode selection means sequentially selecting the respective first, second or third-phase clock signal according to the mode selection signal;

a simultaneous mode selection means simultaneously selecting one clock signal of the first to third-phase clock signals according to the inverted mode selection signal; and an output means outputting an output signal of the simultaneous mode selection means or the sequential mode selection means as one of the respective the three-phase clock signals.

19. The clock signal generation circuit for a LCD driver as claimed in claim 18, wherein each of the inversion means of the first, second and third-phase clock signal output means includes an inverter inverting the mode selection signal and providing the inverted mode selection signal to the respective simultaneous mode selection means.

20. The clock signal generation circuit for a LCD driver as claimed in claim 18, wherein the respective sequential mode selection means in each of the first to third-phase clock signal output means comprises:

a first OR gate receiving the mode selection signal;

a second OR gate receiving the mode selection signal and the respective first, second or third-phase clock signal generated from the first, second or third-phase clock signal generator; and a first exclusive OR gate receiving output signals of the first and second OR gates to sequentially output the respective first, second, or third-phase clock signals as one of the three-phase clock signals to the output means of the respective first, second and third-phase clock signal output means.

21. The clock signal generation circuit for a LCD driver as claimed in claim 20, wherein the respective simultaneous mode selection means in each of the first to third-phase clock signal output means comprises:

a third OR gate receiving the inverted mode selection signal from the respective inversion means;

a fourth OR gate receiving the inverted mode selection signal and one clock signal of the first to third-phase clock signals generated from the respective first, second and third-phase clock signal generators; and a second exclusive OR gate receiving output signals of the third and fourth OR gates to simultaneously output the one clock signal as one of the three-phase clock signals to the respective output means of each of the first, second and third-phase clock signal output means.

22. The clock signal generation circuit for a LCD driver as claimed in claim 21, wherein the respective output means in the first to third-phase clock signal output means includes a fifth OR gate for providing an output signal of the sequential mode selection means or the simultaneous mode selection means as one of the three-phase clock signals.

* * * * *